US011677019B2

(12) United States Patent
Chi et al.

(10) Patent No.: US 11,677,019 B2
(45) Date of Patent: Jun. 13, 2023

(54) IGBT DEVICE WITH NARROW MESA AND MANUFACTURE THEREOF

(71) Applicant: SiEn (QingDao) Integrated Circuits Co., Ltd., Shandong (CN)

(72) Inventors: Min-Hwa Chi, Qingdao (CN); Ching-Ju Lin, Qingdao (CN); Ying-Tsung Wu, Qingdao (CN); Conghui Liu, Qingdao (CN); Longkang Yang, Qingdao (CN); Huan Wang, Qingdao (CN); Richard Ru-Gin Chang, Qingdao (CN)

(73) Assignee: SiEn (QingDao) Integrated Circuits Co., Ltd., Qingdao (CN)

( * ) Notice: Subject to any disclaimer, the term of this patent is extended or adjusted under 35 U.S.C. 154(b) by 175 days.

(21) Appl. No.: 17/347,707

(22) Filed: Jun. 15, 2021

(65) Prior Publication Data
US 2021/0391453 A1    Dec. 16, 2021

(30) Foreign Application Priority Data
Jun. 16, 2020   (CN) .......................... 202010548983.8

(51) Int. Cl.
*H01L 29/739*    (2006.01)
*H01L 29/08*     (2006.01)
*H01L 29/06*     (2006.01)
*H01L 29/66*     (2006.01)

(52) U.S. Cl.
CPC ...... *H01L 29/7397* (2013.01); *H01L 29/0649* (2013.01); *H01L 29/0804* (2013.01); *H01L 29/66348* (2013.01)

(58) Field of Classification Search
CPC ............ H01L 29/7397; H01L 29/0649; H01L 29/0804; H01L 29/66348
USPC ....................................................... 257/623
See application file for complete search history.

(56) References Cited

U.S. PATENT DOCUMENTS

2015/0349103 A1* 12/2015 Onozawa ............ H01L 29/0696
                                                        257/144
2022/0320322 A1* 10/2022 Ngwendson .......... H01L 29/407

* cited by examiner

*Primary Examiner* — Igwe U Anya
(74) *Attorney, Agent, or Firm* — Chen Yoshimura LLP

(57) ABSTRACT

The present application provides an insulated gate bipolar transistor (IGBT) device with narrow mesa and a manufacture thereof. The device comprises: a semiconductor substrate; gate trench structures and emitter trench structures formed on front surface of the semiconductor substrate and alternately arranged along with horizontal direction; wherein the gate trench structures and the emitter trench structures are respectively set in pair along with the arrangement direction, and the pairs of the gate trench structures and the pairs of the emitter trench structures are set in alternate arrangement along with the arrangement direction; well regions formed between the emitter trench structures of one pair; emitter injection regions formed between the gate trench structures of one pair and between the emitter trench structures of one pair, respectively; and wherein, in the region between the emitter trench structures of the one pair, the emitter injection region is above the well region.

13 Claims, 5 Drawing Sheets

IGBT DEVICE WITH NARROW MESA AND MANUFACTURE THEREOF

BACKGROUND OF THE INVENTION

1. Field of the Invention

The present invention relates to manufacture of semiconductor integrated circuit, and more particularly to IGBT device with narrow mesa and its manufacture.

2. Description of the Related Art

In the power devices constituted by insulated gate bipolar transistor (IGBT), on-resistance ($R_{on}$) and breakdown voltage (BV) are important parameters for determining switching performance of the power device. The industry research focuses on how to obtain a device with a higher breakdown voltage and a lower on-resistance simultaneously.

Currently, a narrow mesa structure is introduced into the trench IGBT device to effectively reduce $R_{on}$ of IGBT. In the above IGBT device with narrow mesa, the width of mesa between trenches is generally about two folds of the thickness of the inversion layer of the device, such as 20-40 nm. Ron of the device can be reduced by enhancement of electron density as well as injection efficiency through the narrow mesa area.

However, in the conventional IGBT device with narrow mesa, the conductivity modulation of electrons and holes in base region causes collector induced barrier lowering (CIBL) problem. CIBL makes the saturation current of the device increase and further weakens the short circuit resistance of the IGBT device, thereby the IGBT device performance is seriously impacted. With respect to the above disadvantages, various structural improvements of IGBT device are provided to intend to suppress the CIBL problem in the IGBT device with narrow mesa. However, the above improved structure of IGBT device cannot completely eliminate CIBL, thereby the applications of the IGBT device with narrow mesa are significantly limited.

Therefore, there is a need for a new insulated gate bipolar transistor (IGBT) device with narrow mesa and its manufacture to address the above problems.

SUMMARY

To address the problems of the conventional techniques, the present application provides an insulated gate bipolar transistor (IGBT) device with narrow mesa and its manufacture. The present application is to solve the collector induced barrier lowering (CIBL) problem existed in the conventional IGBT device with narrow mesa.

Accordingly, the present application provides an insulated gate bipolar transistor (IGBT) device with narrow mesa comprising:
a semiconductor substrate;
active gate trench structures and inactive emitter trench structures formed on front surface of the semiconductor substrate and alternately arranged along with horizontal direction; wherein the active gate trench structures and the inactive emitter trench structures are respectively set in pair along with the arrangement direction, and the pairs of the gate trench structures and the pairs of the inactive emitter trench structures are set in alternate and overlapping arrangement along with the arrangement direction;
well regions, wherein the well region is formed between the inactive emitter trench structures of one pair;
inactive emitter injection regions, wherein the inactive emitter injection region is formed between the active gate trench structures of one pair and between the inactive emitter trench structures of one pair, respectively; and
wherein, in the region between the inactive emitter trench structures of the one pair, the inactive emitter injection region is above the well region.

In one embodiment, the IGBT device with narrow mesa further comprises a dummy doped region formed in the semiconductor substrate and between the active gate trench structure and the neighboring inactive emitter trench structure.

In one embodiment, the IGBT device with narrow mesa further comprises an isolation layer formed on the semiconductor substrate and between the active gate trench structure and the neighboring inactive emitter trench structure.

In one embodiment, the IGBT device with narrow mesa further comprises an emitter metal layer formed on the semiconductor substrate, and a back-side implanted layer and a collector metal layer formed on the back-side surface of the semiconductor substrate.

In one embodiment, the active gate trench structure and the inactive emitter trench structure comprises a polysilicon layer and a gate oxidation layer formed between the polysilicon layer and the semiconductor substrate.

In one embodiment, the polysilicon layer is formed by a material comprising a doped polysilicon.

In one embodiment, the active gate trench structure and the inactive emitter trench structure comprise a gate metal layer and a gate oxidation layer formed between the gate metal layer and the semiconductor substrate.

In one embodiment, the gate metal layer comprises a conductive metal layer and a work function metal layer formed between the conductive metal layer and the gate oxidation layer.

In one embodiment, the spacing between the inactive emitter trench structures in one pair is greater than that between the active gate trench structures in one pair.

The present application also provides a method for forming an IGBT device with narrow mesa comprising the following steps:
1) providing a semiconductor substrate;
2) forming active gate trench structures and inactive emitter trench structures in alternate arrangement along with horizontal direction on front surface of the semiconductor substrate; wherein the active gate trench structures and the inactive emitter trench structures are respectively set in pair along with the arrangement direction, and the pairs of the active gate trench structures and the pairs of the inactive emitter trench structures are set in alternate arrangement along with the arrangement direction;
3) forming well regions, wherein each well region is formed between the inactive emitter trench structures of one pair;
4) forming emitter regions between the active gate trench structures of one pair and between the inactive emitter trench structures of one pair, respectively; and wherein, in the region between the inactive emitter trench structures of the one pair, the emitter region is above the well region.

In one embodiment, in the step 2), a step of forming a dummy doped region in the semiconductor substrate and between the active gate trench structure and the neighboring inactive emitter trench structure is further comprised.

In one embodiment, in the step 2), a step of forming an isolation layer on the semiconductor substrate and between the active gate trench structure and the neighboring inactive emitter trench structure is further comprised.

In one embodiment, after the step 4), a step of forming an emitter metal layer on the semiconductor substrate, and forming a back-side implant layer and a collector metal layer on the back-side surface of the semiconductor substrate is further comprised.

As described above, the present application provides an IGBT device with narrow mesa and its manufacture, and has the following advantages.

In the present application, none of P-type doping region is set in active mesa (in between the active gate trench structure). Instead, the P-type doping region and N+-type doping region on the above of the P-type doping region are formed in inactive mesa (in between the inactive emitter trench structure). By introducing the active narrow mesa regions, the electron density is enhanced and the lower Ron of the device is obtained. The short circuit resistance of the device is enhanced because of the elimination of holes in the active narrow mesa. Accordingly, CIBL can be eliminated.

LIST OF REFERENCE SYMBOLS

Figure 1:
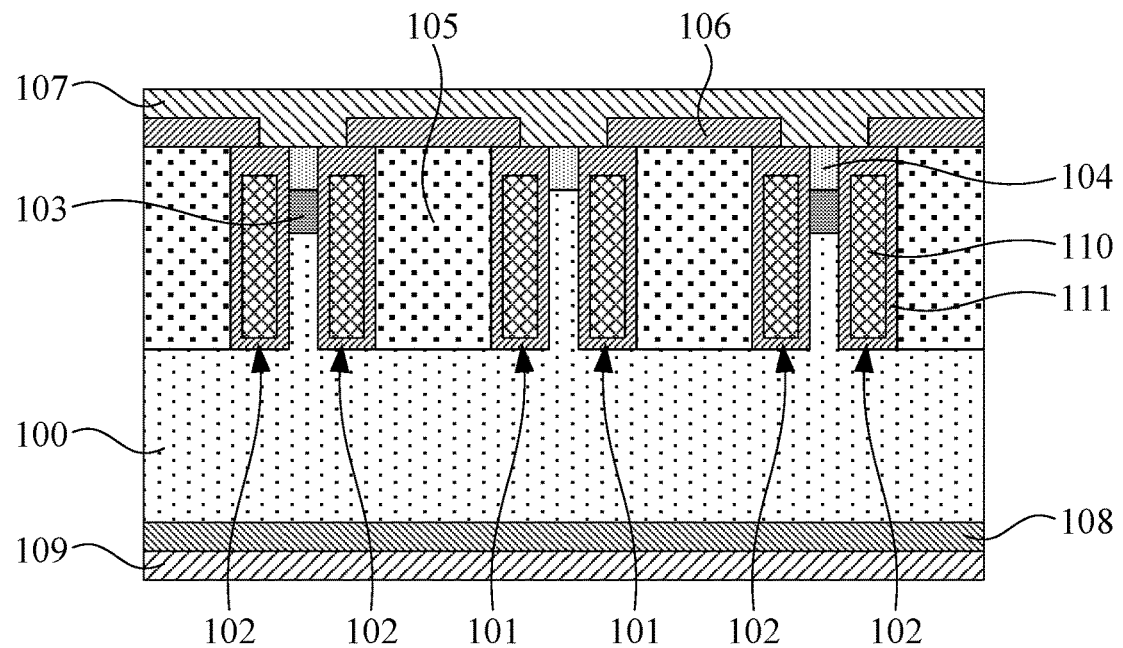
FIG. 1 is a cross-sectional view illustrating an IGBT device with narrow mesa of Example 1 of the present application.

100 semiconductor substrate
100*a* rigid mask layer
101 gate trench structure
101*a* gate trench
102 emitter trench structure
102*a* emitter trench
103 well region
103*a* first photoresist layer
104 emitter region
104*a* second photoresist layer
105 dummy doped region
106 isolation layer
107 emitter metal layer
108 back-side implant layer
109 collector metal layer
110 gate electrode material layer
111 gate oxidation layer
112 collector electrode
113 gate electrode
114 emitter electrode

DETAILED DESCRIPTION OF THE EMBODIMENTS

To fully understand the present application, the preferred embodiments of the present application are described in detail below. The advantages and effects of the present application can be easily understood by a person having ordinary skills in the art based on the present specification. The present application may have other embodiments in addition to the detailed description. Various modifications and variations for the details disclosed in the present specification can be made based on different views and applications, without departing from the spirit of the present application.

Referring FIG. 1 to FIG. 9, these drawings provided in the examples are merely for illustrative description of the basic concept of the present application. The drawings merely show the components relating to the present application, but are not illustrated based on the actual practice including number, shape and size of the components. In practice, the shape, number and ratio of the components may be changed randomly, and the arrangement of the components may be more complex.

EXAMPLES

Example 1

Figure 2:
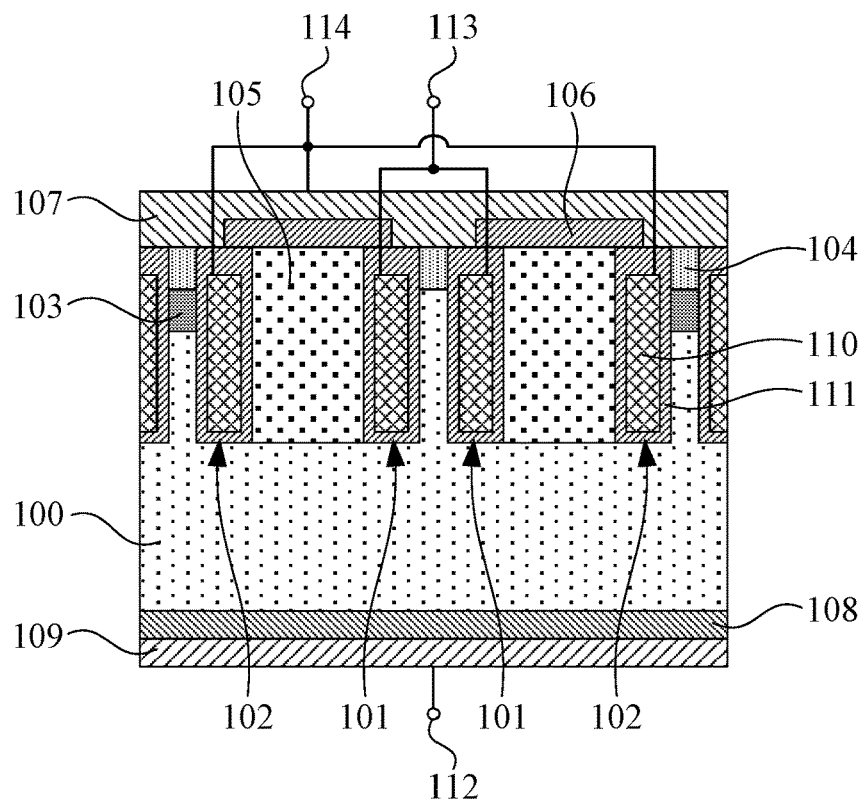
FIG. 2 is a cross-sectional view illustrating the structure of one unit of the
IGBT device with narrow mesa of Example 1 of the present application.
Figure 3:
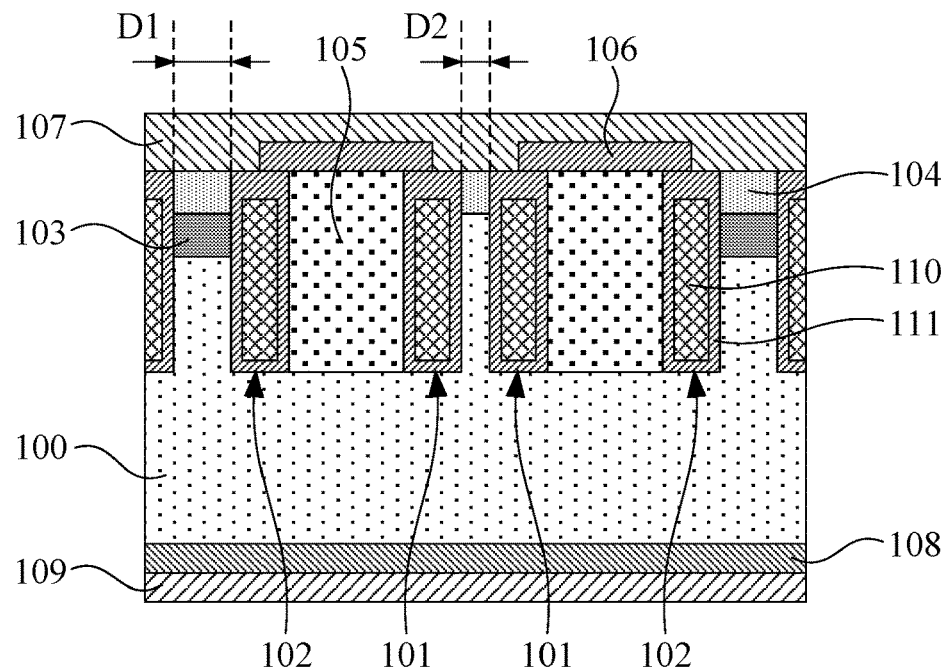
FIG. 3 is a cross-sectional view illustrating the structure of one unit of the
IGBT device with narrow mesa of Example 1 of the present application.

Referring FIG. 1 to FIG. 3, this example provides an IGBT device with narrow mesa comprising:
a semiconductor substrate 100;
active gate trench structures 101 (with connection to the gate bias and referred to as the "active gate trench structure") and inactive emitter trench structures 102 (with connection to the grounded emitter and referred to as the "inactive emitter trench structure") formed on front surface of the semiconductor substrate 100 and alternately arranged along with horizontal direction; wherein pairs of the active gate trench structures 101 and pairs of the inactive emitter trench structures 102 are set along with the arrangement direction, and the pairs of the active gate trench structures 101 and the pairs of the inactive emitter trench structures 102 are set in alternate arrangement along with the arrangement direction;
well regions 103, wherein the well region 103 is formed between the one pair of the inactive emitter trench structures 102;
emitter regions 104, which is formed between one pair of the active gate trench structures 101 and between one pair of the inactive emitter trench structures 102, respectively; and wherein, in the region between the two inactive emitter trench structures 102 in one pair, the emitter region 104 is above the well region 103.

As shown in FIG. 1, the semiconductor substrate 100 is, for example, a layer of N-type doped semiconductor material. The material of semiconductor substrate can be selected from silicon (Si), silicon germanium (SiGe), gallium nitride (GaN) and silicon carbide (SiC). Optionally, an N+-type doped buffer layer (not shown in FIG. 1) can be formed under the layer of N-type doped semiconductor material for PT (puch-through) type IGBT devices.

In one embodiment, as shown in FIG. 1, the active gate trench structure 101 and the inactive emitter trench structure 102 are formed on the front surface of the semiconductor substrate 100 and arranged alternately along a horizontal direction. The active gate trench structure 101 is set in pairs along the arrangement direction, the inactive emitter trench structure 102 is set in pairs along the arrangement direction, and the pairs of the active gate trench structure 101 and the pairs of inactive emitter trench structure 102 are arranged alternately along the arrangement direction. In FIG. 1, one pair of the active gate trench structure 101 is shown in middle, and two pairs of the inactive emitter trench structure 102 are respectively set on the left and right of the pair of the active gate trench structure 101. As described above, the pairs of the active gate trench structure 101 and the pairs of the inactive emitter trench structure 102 are arranged alternately along the horizontal direction relative to FIG. 1, namely, pairs of the active gate trench structure 101 (not shown) are respectively set the left and right outside the pairs of the inactive emitter trench structure 102. Accordingly, in the present application, the IGBT device with narrow mesa has GGEE (i.e. Gate-Gate-Emitter-Emitter) type structure, which is constituted by the repeated arrangement of two gates and two emitters.

In one embodiment, as shown in FIG. 1, the IGBT device with narrow mesa further comprises a dummy doped region 105 formed in the semiconductor substrate 100 and between the active gate trench structure 101 and the neighboring in-active emitter trench structure 102. Optionally, the dummy doped region 105 is a floating P-type doping region (i.e. floating P-dummy), which is formed by ion implantation on the surface of the semiconductor substrate 100. The span of the dummy doped region 105 can be adjusted based on the needs of device design to achieve the best level for narrow mesa density in the device region.

In one embodiment, the structure of one cell of the IGBT device with narrow mesa is shown in FIG. 2. In one cell, its cell pitch is counted from the vicinity of the complete inactive emitter trench structure 102 from left to right, including the P-type dummy doped region 105 on the left and right of the active gate trench structure 101, one mesa (referred to as "active mesa") between the pair of the active gate trench structure 101, and one mesa (referred to as "inactive mesa") between the pair of the inactive emitter trench structure 102. In particular, the number of inactive mesa contained in one cell is calculated as 1 because two inactive mesa are set on the left and right of the one cell and shared with the neighboring two cells, i.e. 0.5 and 0.5.

In another embodiment, as shown in FIG. 3, the width D1 of the "inactive mesa" between the pair of the inactive emitter trench structure 102 can be optimized larger or smaller than the width D2 of the "active mesa" between the pair of the active gate trench structure 101 as holes are collected while the device turns on; but it is at depletion condition while the device turns off. In FIG. 3, the narrow mesa is referring to the width D2 of the active mesa with the width D2 about two folds of a usual thickness of inversion or accumulation layer in device, such as 20-40 nm. By introducing the narrow mesa, the electron density in accumulation (during on-state) can be maximized and a lower on-resistance of the device can be obtained.

For example, in this embodiment, the active gate trench structure 101 and the in-active emitter trench structure 102 have the same material. As shown in FIG. 1, the active gate trench structure 101 and the in-active emitter trench structure 102 comprise a gate electrode material layer 110 and a gate oxidation layer 111 formed between the gate electrode material layer 110 and the semiconductor substrate 100. Material used to form the gate material layer 110 can be selected depending on device design.

For example, in one embodiment of the present application, the gate material layer 110 comprises a polysilicon layer. In one embodiment, the polysilicon layer can be formed by a material comprising an (N-type or P-type) doped polysilicon, which can have improved conductivity. More specifically, the doped polysilicon can be boron doped polysilicon preferably. In one embodiment, the gate material layer 110 further comprises a gate metal layer formed by a metal or a compound containing a metal. In one embodiment, the gate metal layer comprising a conductive metal layer and a work function metal layer formed between the conductive metal layer and the gate oxidation layer 111. More specifically, the conductive metal layer comprises a tungsten layer, and the work function metal layer is constituted by a p-type work function metal preferably, which may contains a titanium nitride (TiN) layer or a tungsten nitride (WN) layer. The work function metal layer can be formed by other metals depending on the needed work function of device design. The gate structure has to be set so that the device can be turned off by the active mesa (by depletion) while the gate is biased to ground or negatively biased.

In other embodiments of the present application, the active gate trench structure 101 and the in-active emitter trench structure 102 may have different structures, and may be formed by different materials in different steps of the process. In one embodiment, the active gate structure may further comprises a separate gate structure (referred to as "split-gate" structure) to reduce the source-drain Miller capacitance. The extra gate can be formed under the usual active gate with connection to the source (i.e. emitter) or left floating, and can be isolated from the usual gate material layer by an isolation medium.

In one embodiment, as shown in FIG. 1, the IGBT device with narrow mesa further comprises a well region 103 formed in the pair and between the inactive emitter trench structures 102, and an emitter region 104 formed between the pair of the active gate trench structure 101 and the pair of the in-active emitter trench structure 102. In one embodiment, the well region 103 is a doping region formed by P-type implantation, such as boron (B) in the semiconductor substrate 100. The emitter region 104 is a doping region formed by N+ implant such as arsenic (As), in the semiconductor substrate 100. As shown in FIG. 1, in the region between the active emitter trench structures 102 in a pair, the in-active emitter injection region 104 is above the well region 103.

In one embodiment, as shown in FIG. 1, the IGBT device with narrow mesa further comprises an isolation layer 106 formed on the semiconductor substrate 100 and between the active gate trench structure 101 and the neighboring in-active emitter trench structure 102. The isolation layer 106 is formed by chemical vapor deposition (CVD) process of Si-oxide. The isolation layer 106 can be used to separate the in-active emitter metal layer 107 and the dummy doped region 105.

In one embodiment, as shown in FIG. 1, the IGBT device with narrow mesa further comprises an emitter metal layer 107 formed on the semiconductor substrate 100, and a back-side implant layer 108 and a collector metal layer 109 formed on the back-side surface of the semiconductor substrate 100. In one embodiment, to form the back-side implant layer 108 and the collector metal layer 109, the back-side process for IGBT device comprises a back-side thinning process, implantation, metalization and so on. The back-side implant layer 108 may include a combination of N-type and P-type implants sequentially performed.

In one embodiment, as shown in FIG. 2, in one unit structure of the IGBT device with narrow mesa, the collector metal layer 109 leads to a collector electrode 112 of the device, the active gate trench structure 101 is connected to the gate electrode 113 of device, the inactive emitter trench structure 102 connects to the emitter metal layer 107 and lead to an emitter electrode 114 of device. The above structure is formed by repeated sequence of two gates (G) and two emitters (E). The GGEE type device is constituted accordingly. In other embodiments, the inactive emitter trench structure 102 may not be connected to the emitter metal layer 107 but applies negative bias for optimized device switching on and off.

In this embodiment, the emitter metal layer 107 is directly formed on the semiconductor substrate 100 and lead to the emitter electrode of the device. In other embodiments, depending on needs of device design, an interlayer dielectric layer and a contact hole structure in the interlayer dielectric layer can be firstly formed on the semiconductor substrate 100, and the contact holes further electrically connects to the metal connecting structure of the layer above to lead to the emitter electrode. The metal connecting structure can have a patterned structure defined by photolithography and etching, and can be covered and protected by a passivation layer. In one embodiment, the metal connecting structure can have plural layers, wherein the plural layers can be connected via holes and isolated via through interlayer metal layers, in order to meet the wiring design requirements of complex device.

In the IGBT device with narrow mesa of this embodiment, the "active mesa" between the active gate trench structures 101 in one pair does not contain P-type doping region, i.e. the well region 103, but the "inactive mesa" between the emitter trench structures 102 in one pair contains P-type doped region and N+ region above the P-type doped region. While the device turns on, electrons accumulate in the active mesa to reduce on-resistance ($R_{on}$) of the device, and the active mesa has essentially no holes, therefore, the CIBL effect can be eliminated and the device resistance against short circuit can be enhanced. While the device turns off, the "active mesa" and the "inactive mesa" are at depletion condition and show blocked voltage. In the novel IGBT device of the present application, the narrow mesa is introduced to enhance the electron density and obtain the lower on-resistance ($R_{on}$) of the device. Further, the concentration of holes in the active narrow mesa is eliminated to eliminate the CIBL effect and thus enhance the device resistance against short circuit.

Example 2

Referring FIG. 4 to FIG. 9, this embodiment provides a method for forming an IGBT device with narrow mesa. The method comprises the following steps:

1) providing a semiconductor substrate 100;
2) forming active gate trench structures 101 and inactive emitter trench structures 102 in alternate arrangement along with horizontal direction on front surface of the semiconductor substrate 100; wherein the active gate trench structures 101 and the in-active emitter trench structures 102 are respectively set in pair along with the arrangement direction, and the pairs of the gate trench structures 101 and the pairs of the in-active emitter trench structures 102 are set in alternate arrangement along with the arrangement direction;
3) forming well regions 103, wherein each well region 103 is formed between the in-active emitter trench structures 102 of one pair; and
4) forming emitter regions 104 between the active gate trench structures 101 of one pair and between the in-active emitter trench structures 102 of one pair, respectively; and wherein, in the region between the in-active emitter trench structures 102 of the one pair, the in-active emitter injection region 104 is above the well region 103.

Figure 4:
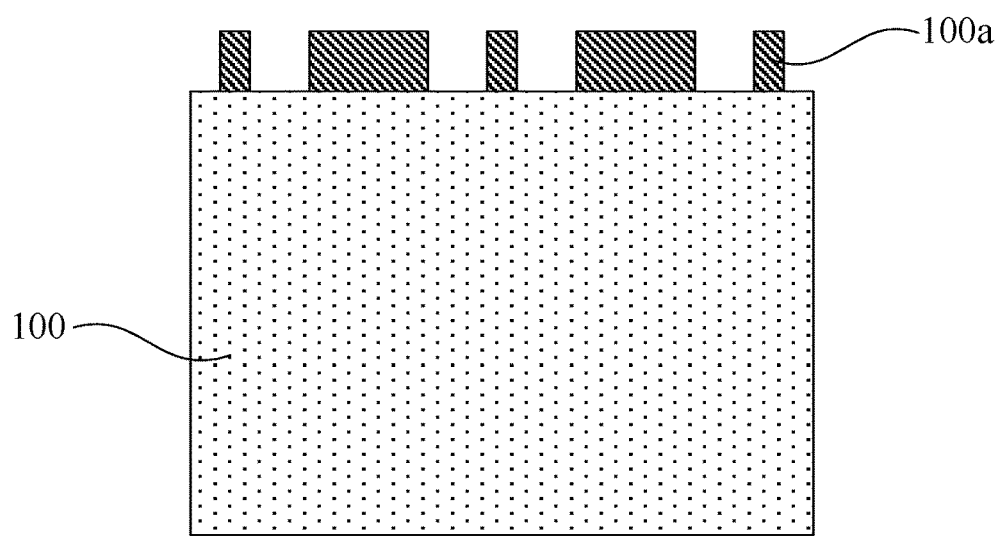
FIG. 4 is a cross-sectional view illustrating, in Example 2 of the present application, a rigid mask layer formed on a semiconductor substrate.

Referring FIG. 4, in the step 1), the semiconductor substrate 100 is provided.

As shown in FIG. 4, the semiconductor substrate 100 can be, for example, a layer of N-type doped semiconductor material. The semiconductor substrate material can be selected from silicon (Si), silicon germanium (SiGe), gallium nitride (GaN) and silicon carbide (SiC). In one embodiment, the layer of N-type doped semiconductor material may be an epitaxial material layer obtained by epitaxy growth on a substrate. For PT IGBT devices, an N+-type doped buffer layer can be formed under the layer of N-type doped semiconductor material.

Figure 5:
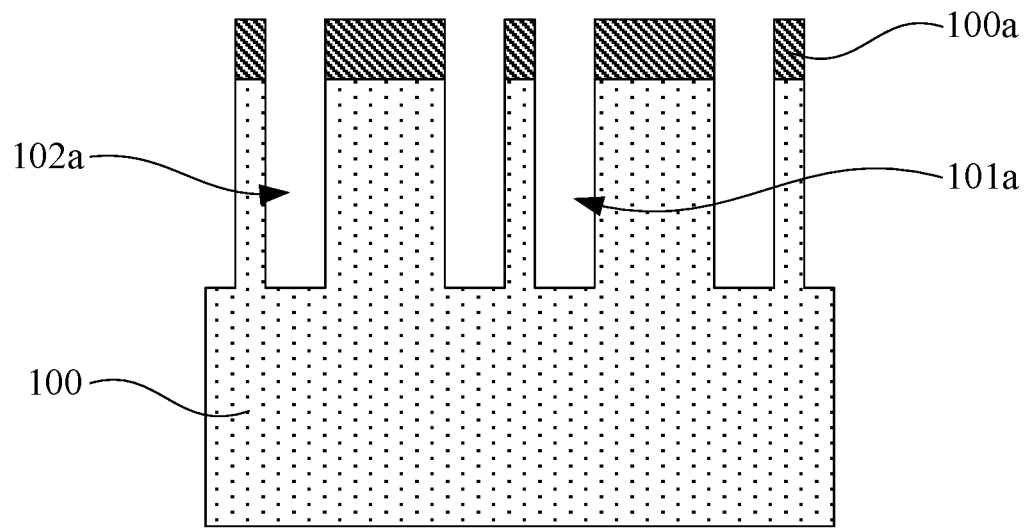
FIG. 5 is a cross-sectional view illustrating, in Example 2 of the present application, the formation of trenches after etching.
Figure 6:
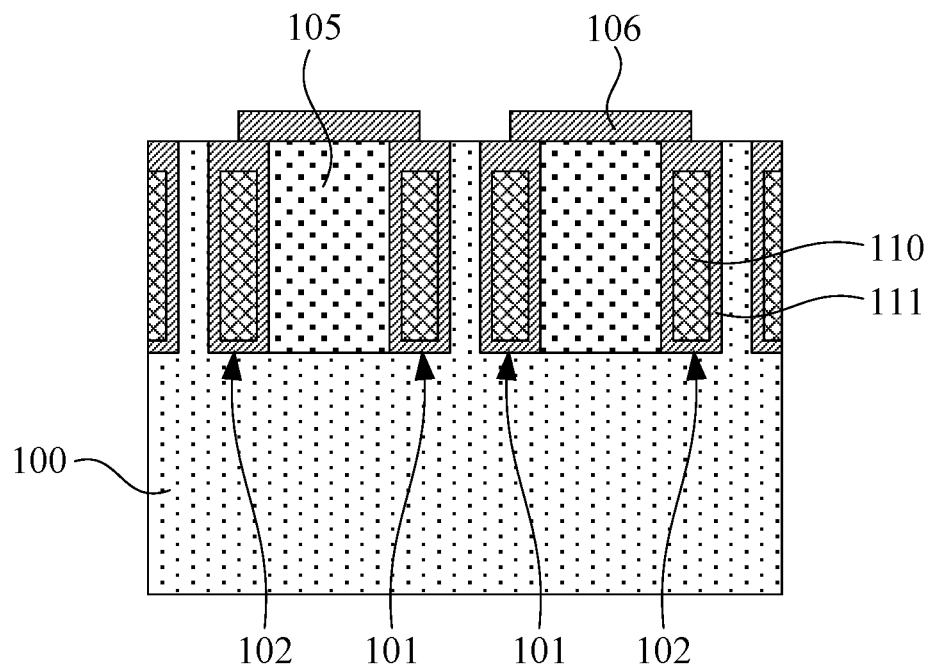
FIG. 6 is a cross-sectional view illustrating, in Example 2 of the present application, the formation of active gate trenches and inactive emitter trenches.

In the step 2), please refer FIG. 4 to FIG. 6, the active gate trench structures 101 and the in-active emitter trench structures 102 are formed in alternate arrangement along with horizontal direction on front surface of the semiconductor substrate 100. The active gate trench structures 101 and the in-active emitter trench structures 102 are respectively set in pair along with the arrangement direction. The pairs of the active gate trench structures 101 and the pairs of the in-active emitter trench structures 102 are set in alternate arrangement along with the arrangement direction.

As shown in FIG. 4, a patterned hard mask layer 100a is formed on the front surface of the semiconductor substrate 100 via deposition of the hard mask material, photolithography and etching processes. The hard mask layer 100a is used as an etching mask in the following etching steps. The patterns of the hard mask layer define the patterns of the trench structure.

As shown in FIG. 5, the active gate trench 101a and the in-active emitter trench 102a can be formed by dry etching process using the hard mask layer 100a as etching mask. In this embodiment, the active gate trench 101a and the in-active emitter trench 102a have same characteristic dimension (CD) and same etching depth. In FIG. 5, one pair of the active gate trenches 101a is in the middle region, and the in-active emitter trenches 102a are respectively in the left and right regions. In other embodiments, the active gate trench 101a and the in-active emitter trench 102a may have different characteristic dimensions (CD) and different etching depths for optimizing device performance. In one embodiment, for the silicon-containing semiconductor substrate 100, the anisotropic dry etching process using $SF_6$ or HBr as etching gas source can be applied. After the etching process completed, the hard mask layer 100a may be removed by wet etching process.

In this embodiment, the hard mask layer 100a is used as an etching mask in the dry etching process because of its high etch selectivity ratio as well as good uniformity. In other embodiments, a photoresist layer can be used as the etching mask in the dry etching process.

As shown in FIG. 6, the gate oxidation layer 111 and the gate material layer 110 are respectively formed in the active gate trench structure 101 and in-active emitter trench structure 102.

For example, in one embodiment of the present application, the gate material layer 110 comprises a polysilicon layer. In one embodiment, the polysilicon layer can be formed by a material comprising a doped polysilicon, which can have improved conductivity. More specifically, the N-type or P-type doped polysilicon can be boron doped polysilicon preferrably. In other embodiments, the gate material layer 110 further comprises a gate metal layer formed by a metal or a compound containing a metal. In one embodiment, the gate metal layer comprising a conductive metal layer and a work function metal layer formed between the conductive metal layer and the gate oxidation layer 111. More specifically, the conductive metal layer comprises a tungsten (W) layer, and the work function metal layer is constituted by a p-type work function metal preferably, which may contains a titanium nitride (TiN) layer or a tungsten nitride (WN) layer. The work function metal layer can be formed by other work function metals depending on the needed work function for device design. The gate oxidation layer 111 can be obtained by thermal oxidation growth of a thermal oxidation layer on the semiconductor substrate 100. After formation of the gate material layer 110, a silicon dioxide layer is set to cover its top. The silicon dioxide layer and the gate oxidation layer 111 integrally pack and cover the gate material layer 110.

In one embodiment, as shown in FIG. 6, the dummy doped region 105 is formed in the semiconductor substrate 100 and between the active gate trench structure 101 and the neighboring in-active emitter trench structure 102. In one embodiment, the dummy doped region 105 is a P-type doping, which is formed by ion implantation on the surface of the semiconductor substrate 100. The span of the dummy doped region 105 can be adjusted depending on the needs of device design to achieve optimized performance.

In one embodiment, as shown in FIG. 6, after formation of the dummy doped region 105, the isolation layer 106 is formed on the semiconductor substrate 100 and between the active gate trench structure 101 and the neighboring in-active emitter trench structure 102. The isolation layer 106 is formed by chemical vapor deposition (CVD) process of Si-oxide. The isolation layer 106 can be used to separate the emitter metal layer 107 and the dummy doped region 105.

Figure 7:
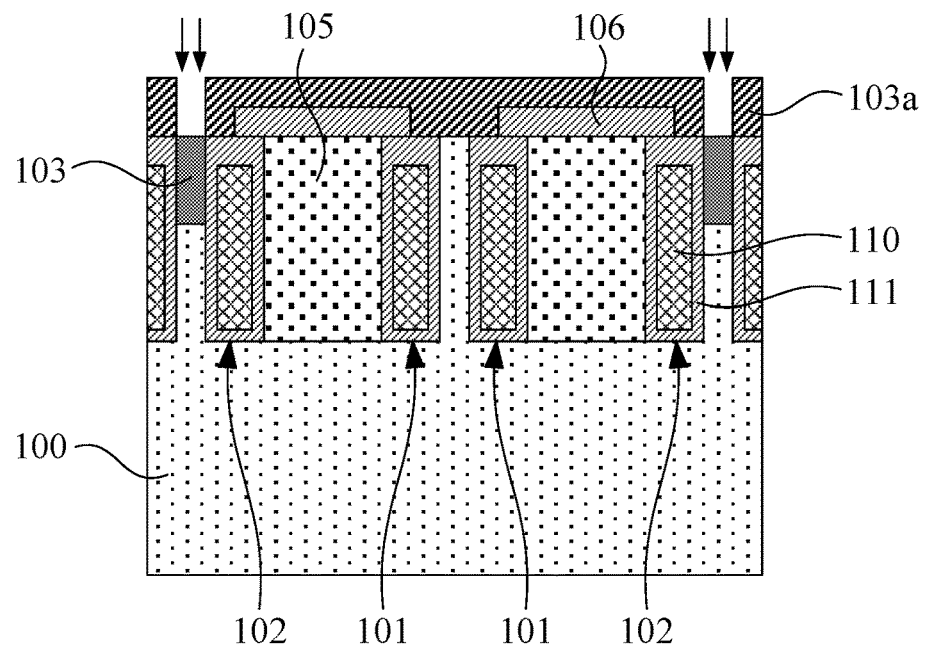
FIG. 7 is a cross-sectional view illustrating, in Example 2 of the present application, the formation of well regions by ion implantation.

In the step 3), referring FIG. 7, the well region 103 is formed between the in-active emitter trench structures 102 in one pair. In FIG. 7, a first photoresist layer 103*a* is used to cover the regions not subjected to ion implantation. Ion implantation is applied to the region between the in-active emitter trench structures 102 in one pair to obtain the well region 103. The arrow shown in the figure indicates the region subjected the ion implantation. In one embodiment, the well region 103 is a P-type doped region formed by implantation, such as boron (B), in the semiconductor substrate 100. It should note that, the first photoresist layer 103*a* is formed mainly to protect non-implant regions. If the non-implant regions have been covered or protected by such as oxide layer, the photoresist layer may not be needed for these regions. After the ion implantation, the residual photoresist layer is removed, and the implanted ions are annealed and activated.

Figure 8:
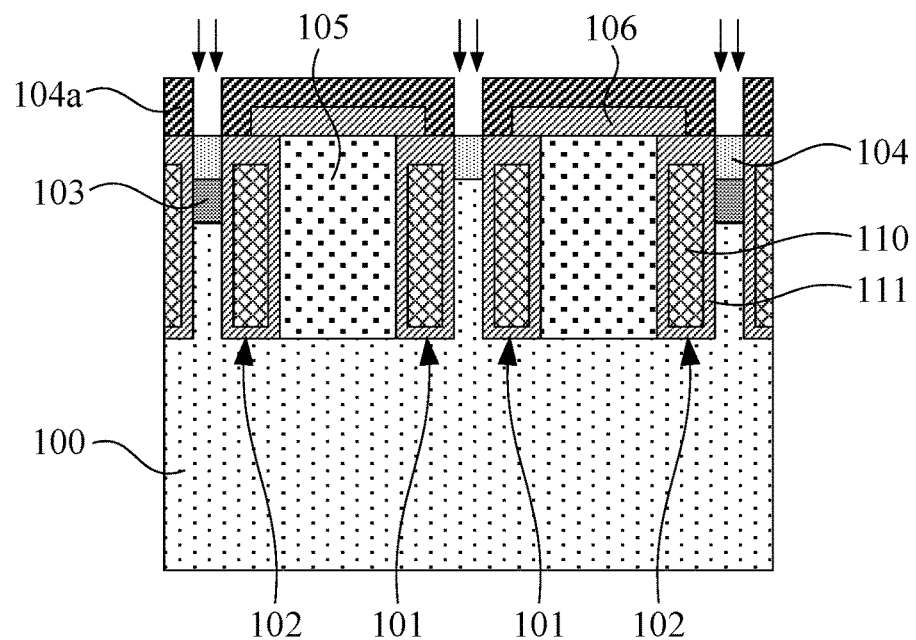
FIG. 8 is a cross-sectional view illustrating, in Example 2 of the present application, the formation of inactive emitter injection regions by ion implantation.

In the step 4), referring FIG. 8, the emitter regions 104 is formed between the active gate trench structures 101 of one pair and between the in-active emitter trench structures 102 of one pair, respectively. In the region between the in-active emitter trench structures 102 of the one pair, the emitter region 104 is above the well region 103. In FIG. 8, a second photoresist layer 104*a* is used to cover the regions not subjected to ion implantation. Ion implantation is applied to the region between the active gate trench structures 101 and between the in-active emitter trench structures 102 to obtain the emitter regions 104. The emitter regions 104 is a doped region formed by N+ implant, such as arsenic(As), in the semiconductor substrate 100. Similar to the step 3), if the non-implanted regions have been covered or protected by oxide layer, the photoresist layer may not be needed for these regions. After ion implantation, the residual photoresist layer is removed, and the implanted ions are annealed and activated.

Figure 9:
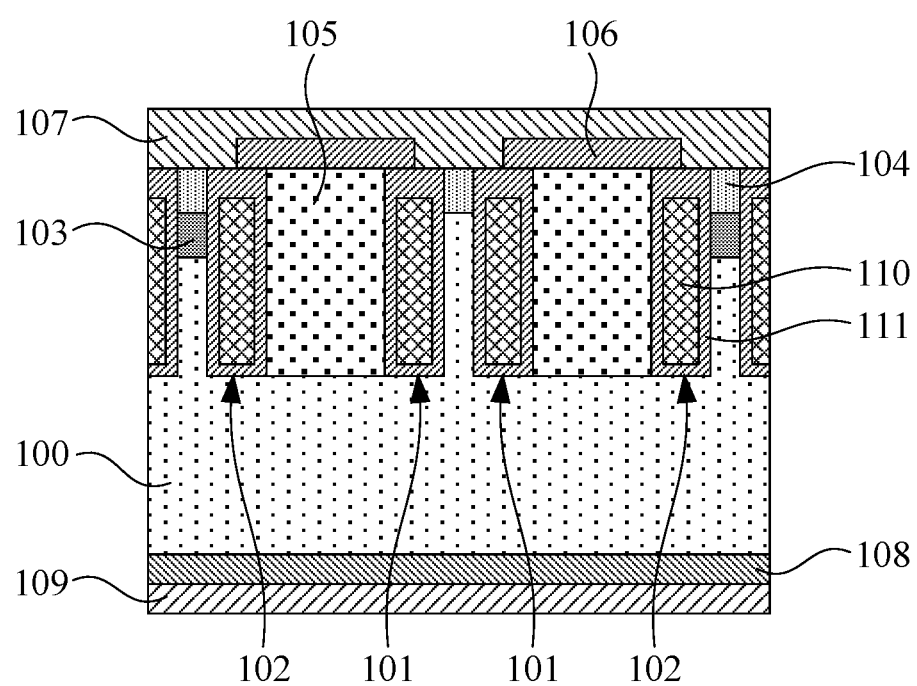
FIG. 9 is a cross-sectional view illustrating, in Example 2 of the present application, the formation of an emitter metal layer, a back-side implant layer and a collector metal layer.

In one embodiment, as shown in FIG. 9, after the step 4), the method further comprises forming the emitter metal layer 107 on the semiconductor substrate 100, and forming the back-side implant layer 108 and the collector metal layer 109 on the back-side surface of the semiconductor substrate 100. In one embodiment, to form the back-side implant layer 108 and the collector metal layer 109, the back-side process for IGBT device comprises back-side thinning, implantation, metallization and so on. The back-side implantation layer 108 is a P-type layer.

This embodiment provides a method for forming an IGBT device with narrow mesa. None of P-type doping region, i.e. the well region 103, is set in active mesa between the active gate trench structures 101. The P-type doping region and the N+ doped region on the above of the P-type doped region are formed in inactive mesa between the paired in-active emitter trench structures 102. The IGBT device with active narrow mesa obtained by this method, the electron density is enhanced and the lower $R_{on}$ of the device is obtained. The short circuit resistance of the device is enhanced because of the elimination of holes in the active narrow mesa. Accordingly, CIBL is eliminated.

According to the above, the present application provides an insulated gate bipolar transistor (IGBT) device with narrow mesa and a manufacturing method thereof. The device comprises: a semiconductor substrate; active gate trench structures and in-active emitter trench structures formed on front surface of the semiconductor substrate and alternately arranged along with horizontal direction; wherein the active gate trench structures and the in-active emitter trench structures are respectively set in pairs, and the pairs of the active gate trench structures and the pairs of the in-active emitter trench structures are set in alternate arrangement along with the arrangement direction; well regions formed between the in-active emitter trench structures; emitter regions formed between the active gate trench structures and between the in-active emitter trench structures respectively; and wherein, in the region between the in-active emitter trench structures, the emitter region is above the well region. In the present application, none of P-type doping region is set in active narrow mesa. Instead, the P-type doping region and N+ doped region on the above of the P-type doped region are formed in the inactive mesa. By introducing the active narrow mesa region, the electron density is enhanced and the lower Ron of the device is obtained. The short circuit resistance of the device is enhanced because of the elimination of holes in active narrow mesa. Accordingly, CIBL is eliminated.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims and its equivalent systems and methods.

What is claimed is:

1. An insulated gate bipolar transistor (IGBT) device with narrow mesa comprising:

a semiconductor substrate;

active gate trench structures and inactive emitter trench structures formed on front surface of the semiconductor substrate and alternately arranged along a horizontal direction; wherein the active gate trench structures and the inactive emitter trench structures are respectively set in pair along the arrangement direction, and the pairs of the active gate trench structures and the pairs of the emitter trench structures are set in alternate arrangement along the arrangement direction;

well regions, wherein the well region is formed between the inactive emitter trench structures of one pair;

emitter regions, wherein the emitter region is formed between the active gate trench structures of one pair and between the inactive emitter trench structures of one pair, respectively; and wherein, in the region between the inactive emitter trench structures of the one pair, the emitter region is above the well region.

2. The IGBT device with narrow mesa of claim 1, further comprising a dummy doped region formed in the semiconductor substrate and between the active gate trench structure and the neighboring inactive emitter trench structure.

3. The IGBT device with narrow mesa of claim 1, further comprising an isolation layer formed on the semiconductor substrate and between the active gate trench structure and the neighboring inactive emitter trench structure.

4. The IGBT device with narrow mesa of claim 1, further comprising an emitter metal layer formed on the semiconductor substrate, and a back-side implant layer and a collector metal layer formed on the back-side surface of the semiconductor substrate.

5. The IGBT device with narrow mesa of claim 1, wherein the active gate trench structure and the inactive emitter trench structure comprises a polysilicon layer and a gate oxidation layer formed between the polysilicon layer and the semiconductor substrate.

6. The IGBT device with narrow mesa of claim 5, wherein the polysilicon layer is formed by a material comprising a doped polysilicon.

7. The IGBT device with narrow mesa of claim 1, wherein the active gate trench structure and the inactive emitter trench structure comprise a gate metal layer and a gate oxidation layer formed between the gate metal layer and the semiconductor substrate.

8. The IGBT device with narrow mesa of claim 7, wherein the gate metal layer comprises a conductive metal layer and a work function metal layer formed between the conductive metal layer and the gate oxidation layer.

9. The IGBT device with narrow mesa of claim 1, wherein the spacing between the inactive emitter trench structures in one pair is greater than that between the active gate trench structures in one pair.

10. A method for forming an IGBT device with narrow mesa comprising:

1) providing a semiconductor substrate;

2) forming active gate trench structures and inactive emitter trench structures in alternate arrangement along with horizontal direction on front surface of the semiconductor substrate; wherein the active gate trench structures and the inactive emitter trench structures are respectively set in pairs along with the arrangement direction, and the pairs of the active gate trench structures and the pairs of the inactive emitter trench structures are set in alternate arrangement along with the arrangement direction;

3) forming well regions, wherein each well region is formed between the inactive emitter trench structures of one pair;

4) forming emitter regions between the active gate trench structures of one pair and between the inactive emitter trench structures of one pair, respectively; and wherein, in the region between the inactive emitter trench structures of the one pair, the inactive emitter injection region is above the well region.

11. The method of claim 10, wherein, in the step 2), further comprising a step of forming a dummy doped region in the semiconductor substrate and between the active gate trench structure and the neighboring inactive emitter trench structure.

12. The method of claim 10, wherein, in the step 2), further comprising a step of forming an isolation layer on the semiconductor substrate and between the active gate trench structure and the neighboring inactive emitter trench structure.

13. The method of claim 10, wherein, after the step 4), further comprising a step of forming an emitter metal layer on the semiconductor substrate, and forming a back-side implant layer and a collector metal layer on the back-side surface of the semiconductor substrate.

* * * * *